United States Patent
Kim

(10) Patent No.: US 6,208,550 B1
(45) Date of Patent: Mar. 27, 2001

(54) FERROELECTRIC MEMORY DEVICE AND METHOD FOR OPERATING THEREOF

(75) Inventor: Jae Whan Kim, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/223,383

(22) Filed: Dec. 30, 1998

(30) Foreign Application Priority Data

Dec. 30, 1997 (KR) .................................................. 97-77876

(51) Int. Cl.[7] .................................................. G11C 11/22
(52) U.S. Cl. .......................... 365/145; 365/203; 365/227; 365/230.06
(58) Field of Search .............................. 365/145, 230.06, 365/203, 202, 207, 227

(56) References Cited

U.S. PATENT DOCUMENTS

| | | | |
|---|---|---|---|
| 4,006,469 | 2/1977 | Leehan et al. | 340/173 |
| 4,420,822 | 12/1983 | Koomen et al. | 365/182 |
| 4,477,886 | 10/1984 | Au | 365/222 |
| 4,811,290 | 3/1989 | Watanabe | 365/149 |
| 5,572,459 | 11/1996 | Wilson et al. | 365/145 |
| 5,600,587 * | 2/1997 | Koike | 365/145 |
| 5,615,144 * | 3/1997 | Kimura et al. | 365/145 |
| 5,640,355 | 6/1997 | Muraoka et al. | 365/207 |
| 5,650,970 | 7/1997 | Kai | 365/203 |
| 5,663,904 | 9/1997 | Arase | 365/145 |
| 5,671,174 * | 9/1997 | Koike et al. | 365/145 |
| 5,768,182 * | 6/1998 | Hu et al. | 365/145 |

OTHER PUBLICATIONS

Patent Abstracts of Japan, "Nonvolatile Semiconductor Storage Device", Publication No. 08204160 A, published Aug. 9, 1996.

Patent Abstracts of Japan, "Semiconductor Memory", Publication No. 10021692 A, published Jan. 23, 1998.

Patent Abstracts of Japan, "Multi–value Dynamic Random Access Memory", Publication No. 61196499 A, published Aug. 30, 1986.

Patent Abstracts of Japan, "Semiconductor Memory", Publication No. 07085661 A, published Mar. 31, 1995.

Patent Abstracts of Japan, "Nonvolatile Semoconductor Memory Device", Publication No. 07093979 A, published Apr. 7, 1995.

* cited by examiner

*Primary Examiner*—David Nelms
*Assistant Examiner*—Thong Le
(74) *Attorney, Agent, or Firm*—Jacobson, Price, Holman & Stern, PLLC

(57) ABSTRACT

A ferroelectric memory device includes memory cells consisted of a switching transistor and a ferroelectric capacitor for storing electric charges, word lines for enabling the switching transistor, positive and negative bit lines for transferring the electric charges, a sense amplifier for sensing a voltage difference between the positive and the negative bit lines and for amplifying the voltage levels of the positive and the negative bit lines. Positively pumped voltage is applied to the positive bit line while positive voltage lower than the positively pumped supply voltage is applied to the negative bit line. With the higher positive bit line, a sensing margin of the sense amplifier is improved and no separate reference cell is required for the sensing the voltage difference. Method for operating for the ferroelectric memory device is also disclosed.

13 Claims, 8 Drawing Sheets

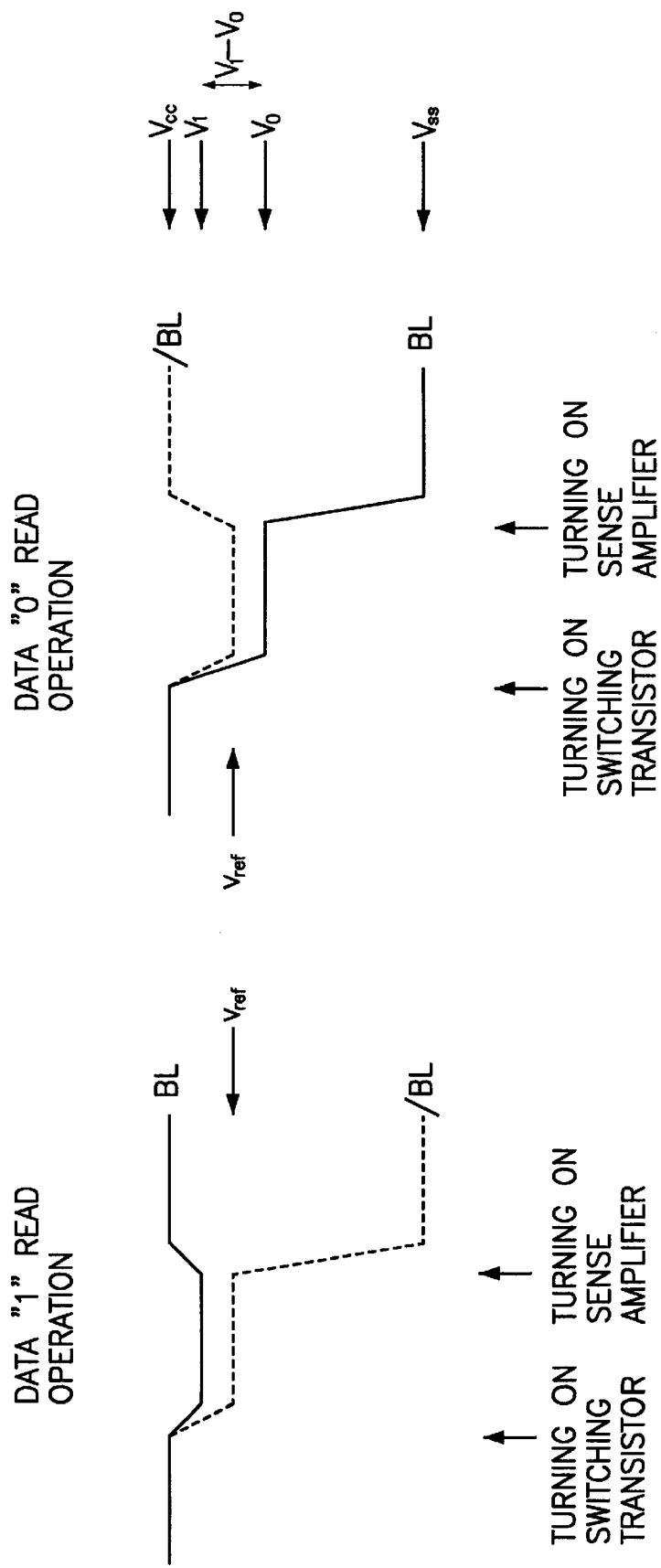

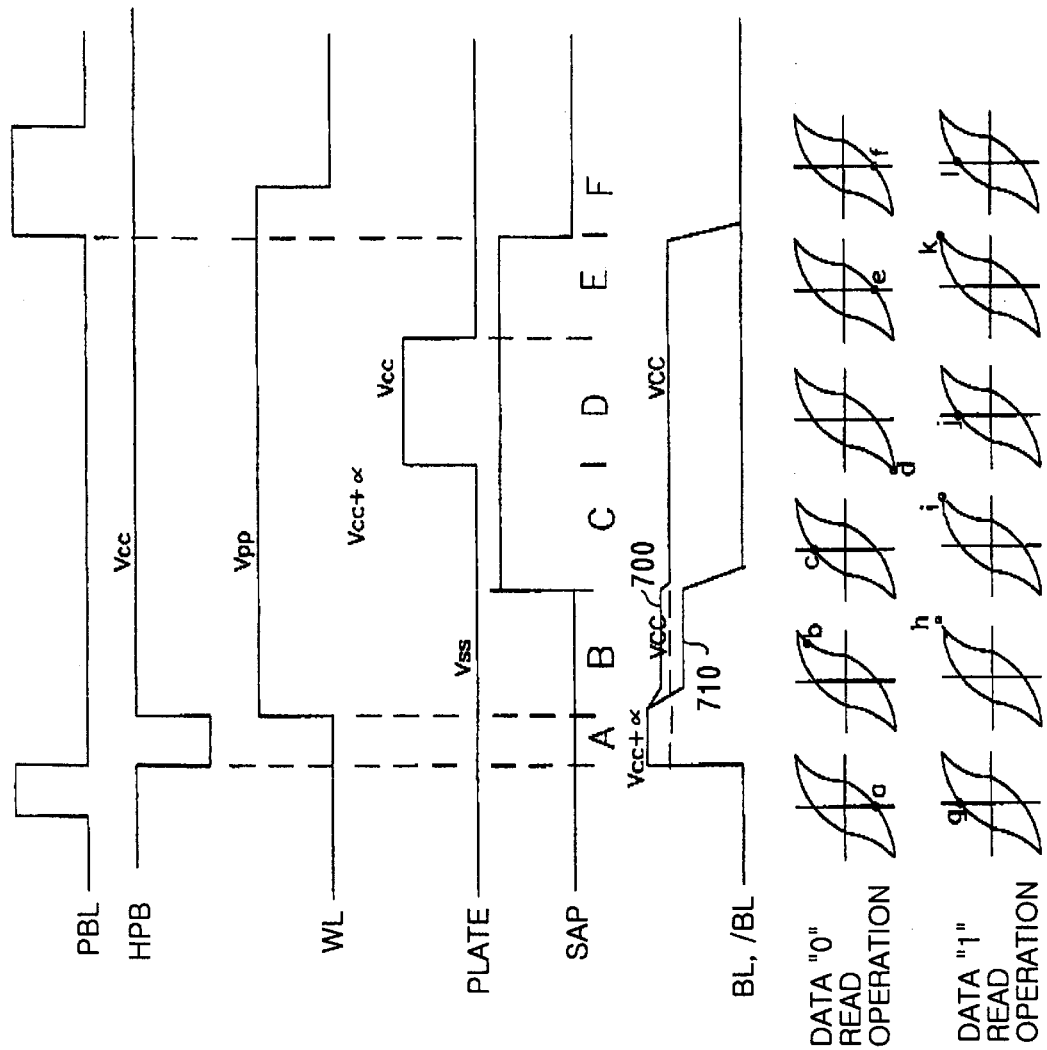

FERROELECTRIC MEMORY DEVICE AND METHOD FOR OPERATING THEREOF

BACKGROUND OF THE INVENTION

1. Field of the Invention

The present invention relates to a ferroelectric memory device using ferroelectric storage cells; and, more particularly, to such a memory device without using separate reference cell for producing a reference voltage which has been used in sensing the data level of the storage cell.

A ferroelectric non-volatile memory device uses a storage capacitor consisting of ferroelectric material sandwiched between two metal electrodes. FIG. 1 shows a hysteresis loop of the charge variation with respect to the voltage applied to the two electrodes A and B of the capacitor represented as a symbol in FIG. 1. Because the ferroelectric capacitor has two stable charge states P1 and P2 when applied voltage is 0 V, binary data can be stored even when power is not supplied. These two stable states can be considered a bistable capacitor which can be used as a storage element of a non-volatile memory device. In the ferroelectric capacitor, the polarization state (alignment in parallel) within the ferroelectric material is varied depending on the value of the applied voltage, which causes the variation of the stored charges. For example, when the ferroelectric capacitor maintains the polarization state of P1 of FIG. 1 and sufficiently large negative voltage, e.g., −3 V or less is applied to the capacitor, the capacitor switches to the polarization state of P3 along the hysteresis loop. If the negative voltage is then removed from the capacitor so as to make the voltage to be 0 V, the capacitor changes to the P2 state. The charge state of the ferroelectric capacitor changes along the arrow direction depending on the applied voltage, so that digital information can be obtained by detecting the variation of the charge induced in the capacitor in the function of the applied voltage.

During the read operation of the ferroelectric memory device, when a word line is selected, a positive bit line (BL) exhibits a different voltage V0 or V1 which is determined by the stored data in the memory cell ("0" or "1"). The voltage signals V0 and V1 are small signals, which need to be amplified by using e.g., a sense amplifier. For sensing and amplifying the voltage signals V0 and V1, a reference signal Vref must be applied to a negative bit line (/BL). The sense amplifier detects whether the voltage of the BL is greater or smaller than the reference voltage Vref applied to the /BL, and amplifies the voltage difference to read out the data "0" or "1" stored in the storage cell.

Accordingly, the value of Vref must be between V0 and V1, and if the voltage difference between V0 and V1 becomes greater, more accurate data read operation is possible. Further, if the capacitance of the main storage cell becomes larger, the voltage difference of V1 and V0 can be made greater. However, this inevitably causes the increase of the cell size.

2. Description of the Related Art

For applying to the /BL the Vref in the middle of V0 and V1, numerous reference cells have been developed in the prior art as described in e.g., "1994, Int. Solid State Circuit Conf., paper FA16.2", "1996, Int. Solid State Circuit Conf., paper SP23.1", and "1996, Symp., VLSI Circuit, paper 5.2".

However, above reference cells are not sufficient to produce reliable middle value between the V0 and the V1. Moreover, the reference cell itself consumes chip area, may cause a noise, and makes the chip operation complicated.

SUMMARY OF THE INVENTION

It is, therefore, an object of the present invention to provide a memory device without using separate reference cell for producing a reference voltage which has been used in sensing the data level of the storage cell.

In accordance with one aspect of the present invention, there is provided a ferroelectric memory device provided with memory arrays which are comprised a plurality of word line and a plurality of positive and negative bit lines which are crossed over each other in a matrix form, and sense amplifiers to detect and amplify voltage difference between the positive and the negative bit lines, and the memory device comprises: voltage generating means for producing positively pumped supply voltage; precharge voltage selecting means, responsive to least significant bits of row addresses from a word line driving circuit, for selecting the positively pumped supply voltage as a precharge voltage for the positive bit line and a normal supply voltage as a precharge voltage for the negative bit line; and precharging means for precharging the positive and the negative bit lines respectively to the positively pumped supply voltage and the normal supply voltage from the precharge voltage selecting means.

In accordance with another aspect of the present invention, there is provided a method for operating a ferroelectric memory device provided with memory cells, each having a switching transistor and a ferroelectric capacitor for storing electric charges, and a plurality of positive and negative bit lines for transferring the electric charges, comprising the steps of: raising the positive bit line to a first positive voltage level and the negative bit line to a second positive voltage level lower than the first positive voltage level; turning on the switching transistor to induce a charge sharing effect between electric charges in both the ferroelectric capacitor and the positive bit line, so that a voltage difference is produced between the positive and the negative bit lines; and sensing the voltage difference and amplifying the voltage developed on the positive bit line to the second positive voltage level or to a ground voltage level depending on the electric charge stored in the ferroelectric capacitor.

Therefore, in accordance with the present invention, the precharge voltage of the positive bit line is increased so that the voltage difference between the positive and the negative bit lines is also increased regardless of the capacitor status. Hence a sensing margin of sense amplifiers and the reliability of the memory device can be improved. In addition, the memory device of the present invention does not use any separate reference cells but uses the voltage level of the negative bit line as a reference voltage for sensing the voltage difference between the positive and the negative bit lines. This results in reduction of the chip size and lower cost.

BRIEF DESCRIPTION OF THE DRAWINGS

The above and other objects and features of the instant invention will become apparent from the following description of prefereed embodiments taken in conjunction with the accompanying drawings, in which:

FIG. 4A is a timing diagram for a read operation of a conventional ferroelectric memory device;

FIG. 7 is a signal waveform of a ferroelectric memory device according to the present invention.

DETAILED DESCRIPTION OF THE PREFERRED EMBODIMENTS

Figure 1:
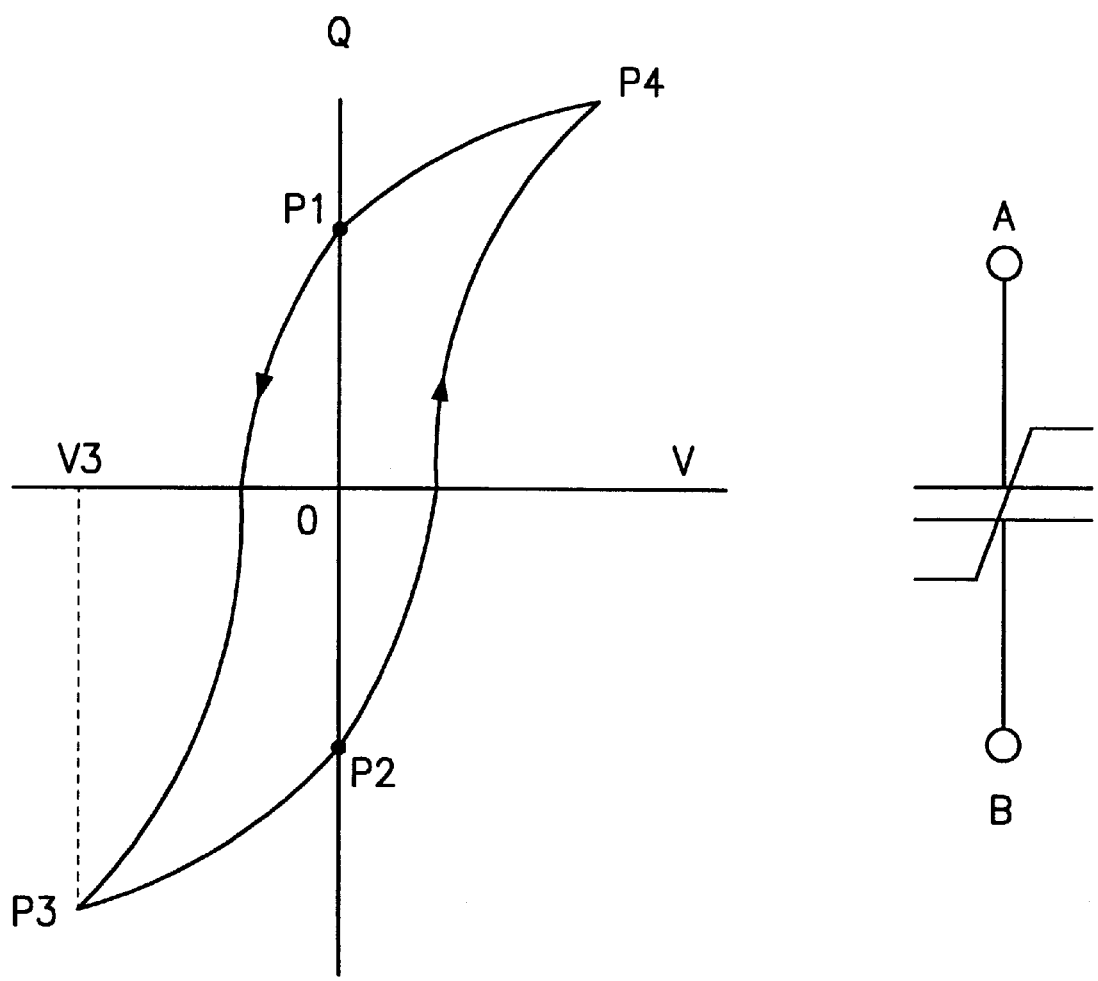
FIG. 1 shows a symbol of a ferroelectric capacitor and a hysteresis loop thereof for showing the relationship between the charge and voltages applied to electrodes A and B of the capacitor.
Figure 2:
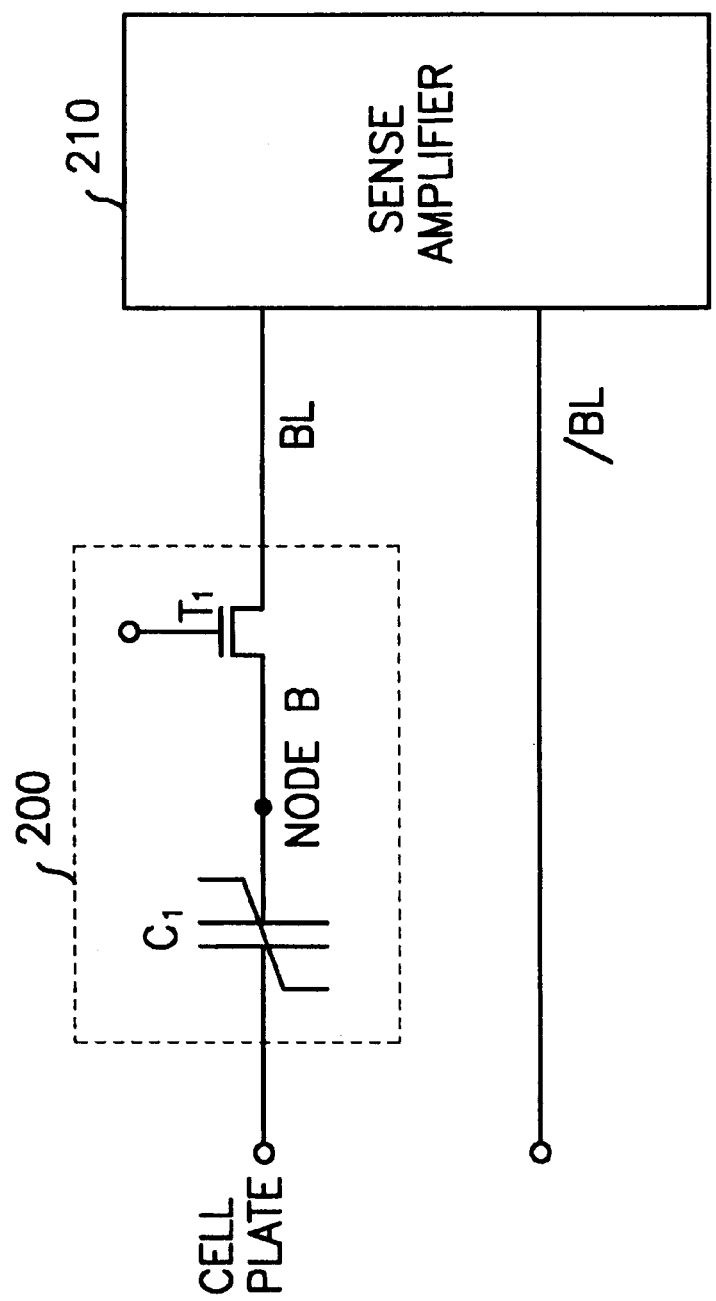
FIG. 2 is a circuit diagram of a ferroelectric memory device.

FIG. 2 is a circuit diagram of a ferroelectric memory device according to the present invention. A main storage cell 200 of the memory device includes a ferroelectric capacitor C1 connected between a cell plate and a node B and a switching transistor T1 connected between the node B and a positive bit line BL. A sense amplifier 210 detects and amplifies the voltage difference between the positive and the negative bit lines BL and /BL. In an operation to read out stored data from the cell in the ferroelectric memory device, a voltage difference is applied to both electrodes of the ferroelectric capacitor C1 of the main cell 200.

For the voltage applying, in the prior art, potentials of both electrodes of the capacitor C1 are initially remained ground potential, i.e., 0 V or VSS level, and then the BL is precharged to the VSS level. By raising the cell plate to the VCC level (positive power supply voltage level) when turning on the switching transistor T1, the voltage difference is produced between two electrodes of the ferroelectric capacitor C1. Alternatively, initial potential of the capacitor electrodes is maintained to the ground VSS level, and then a voltage difference is applied to the ferroelectric capacitor C1 by raising the BL to the VCC level followed by turning on the transistor T1 while the cell plate voltage remaining the VSS. Above two schemes for applying voltage difference to the capacitor are substantially the same to the ferroelectric capacitor C1. In the following description, preferred embodiments of the present invention will be explained with the latter case where the BL is precharged to higher voltage than the cell plate.

Figure 3:
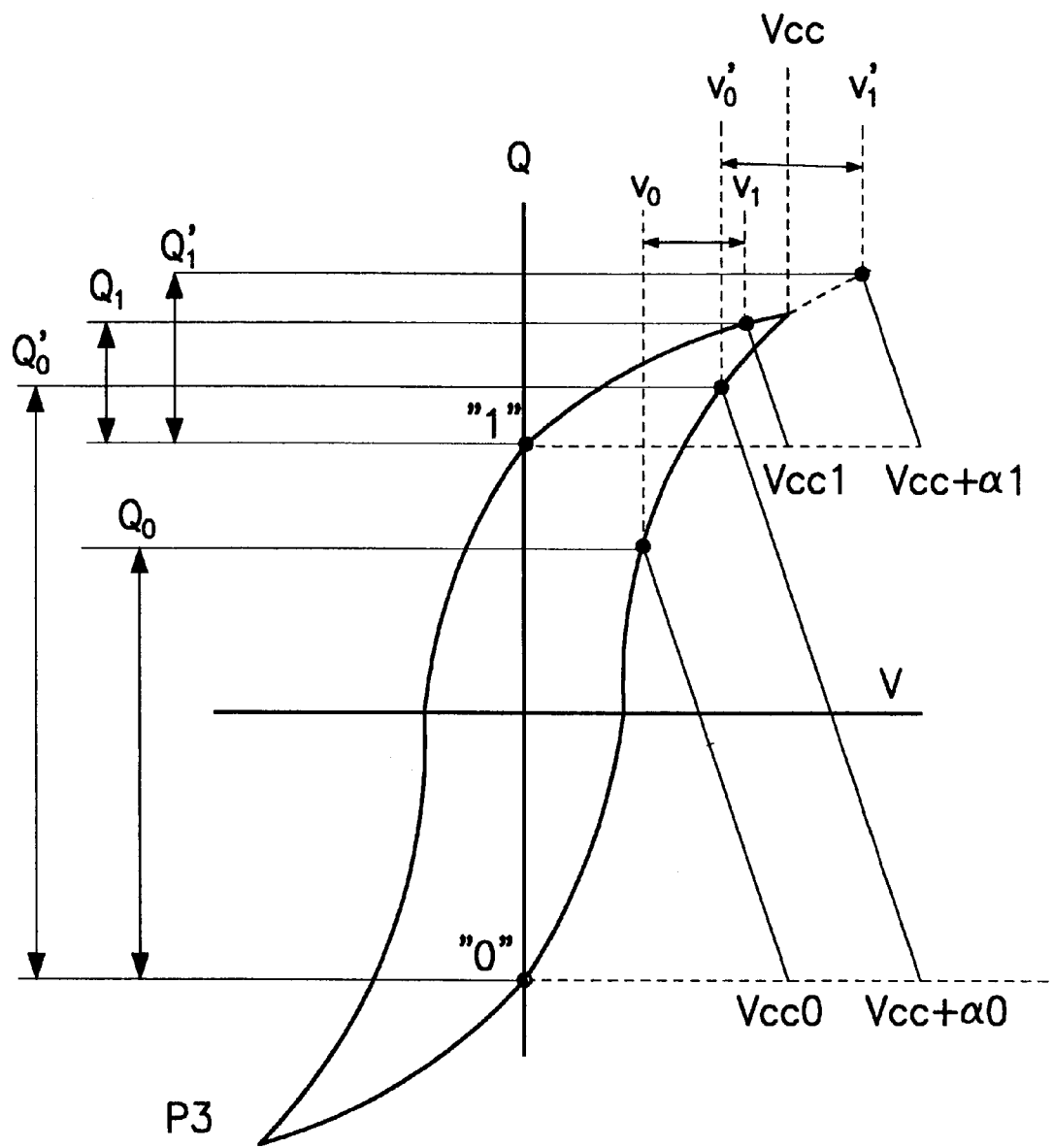
FIG. 3 shows a hysteresis loop of charge Q with respect to the applied voltage V of a ferroelectric capacitor for comparing the voltage variation of the BL in the present invention with that of the prior art.

FIG. 3 shows a hysteresis loop of charge Q with respect to the applied voltage V of a ferroelectric capacitor for comparing the voltage variation of the BL in the present invention with that of the prior art. If the initial voltages applied to the capacitor C1 are VSS, the ferroelectric capacitor C1 will be either in a point "0" (when the storage data is "0") or in a point "1" (when the storage data is "1"), since there is no voltage difference.

When the BL is precharged to the VCC and then the switching transistor T1 is turned on, electrical charge enters into the ferroelectric capacitor so that the voltage of the node B is raised while the voltage of the BL is lowered until two voltages reach to a final identical potential level as a result of a so called charge sharing effect. The final voltage value is determined by the Q-V loop of the ferroelectric capacitor and the capacitance of the BL. If the initial point of the capacitor is "0", the voltage of the node B moves to V0 from the point "0" due to the charge flow of Q0 when the switching transistor T1 turns on. At this time, the BL switches to point V0 from the initial point VCC0 representing the BL having initial voltage of the VCC level. The absolute value of gradient of a line connecting the points VCC0 and V0 is the capacitance of the BL.

On the other hand, if the capacitor is initially at the point "1", charge of Q1 flows out of the capacitor C when the switching transistor Q1 turns on. Therefore, the voltage of the node B of the ferroelectric capacitor goes to point V1 from the initial point "1", and the BL moves to point V1 from the point VCC1. At this time, since the gradient of the Q-V loop varies depending on the initial state of the ferroelectric capacitor C1, the charges Q0 and Q1 are different and the voltages V0 and V1 also have different levels. In other words, the initial states of "0" or "1" of the ferroelectric capacitor C1 result in the BL voltage of V0 or V1, respectively.

In accordance with the present invention, BL is precharged to VCC+$\alpha$ (positively pumped supply voltage level) higher than the VCC level. When the initial state of the ferroelectric capacitor C1 is "0", the node B moves to point V0' from the initial point "0" as the charge of Q0' flows when the switching transistor turns on. The charge Q0' is greater than Q0, and the voltage V0' is higher than the V0, because the initial voltage of BL is increased while the capacitance of the BL is maintained constant. When the capacitor C1 is initially at the point "1", the charge of Q1' flows when the switching transistor turns on so that the node B is changed from the point "1" to the point V1'. The potential of the point V1' is higher than that of the point V1.

As seen from the nature of the Q-V loop of a ferroelectric capacitor, the voltage difference V1'-V0' is always greater than the voltage difference V1-V0 since the line connecting the points V0 and V0' is steeper than the line connecting V1 and V1' and hence the voltage difference V0'-V0 is always smaller than the voltage difference V1'-V1. As a result, sensing margin and reliability of the ferroelectric memory device is improved in the present invention by making the voltage difference of the BL greater in reading data 0 and 1 with the higher bit line precharge voltage.

In addition, by controlling the value of $\alpha$ when the bit line BL is precharged to VCC+$\alpha$, it is possible to locate the VCC in the middle of the points V0' and V1'. With the BL precharge level of VCC+$\alpha$ and /BL precharge level of VCC, it is also possible in a read operation for the sense amplifier to detect and amplify the voltage difference between BL and /BL without using a separate reference cell since the /BL plays a role of the reference voltage.

Figure 4B:
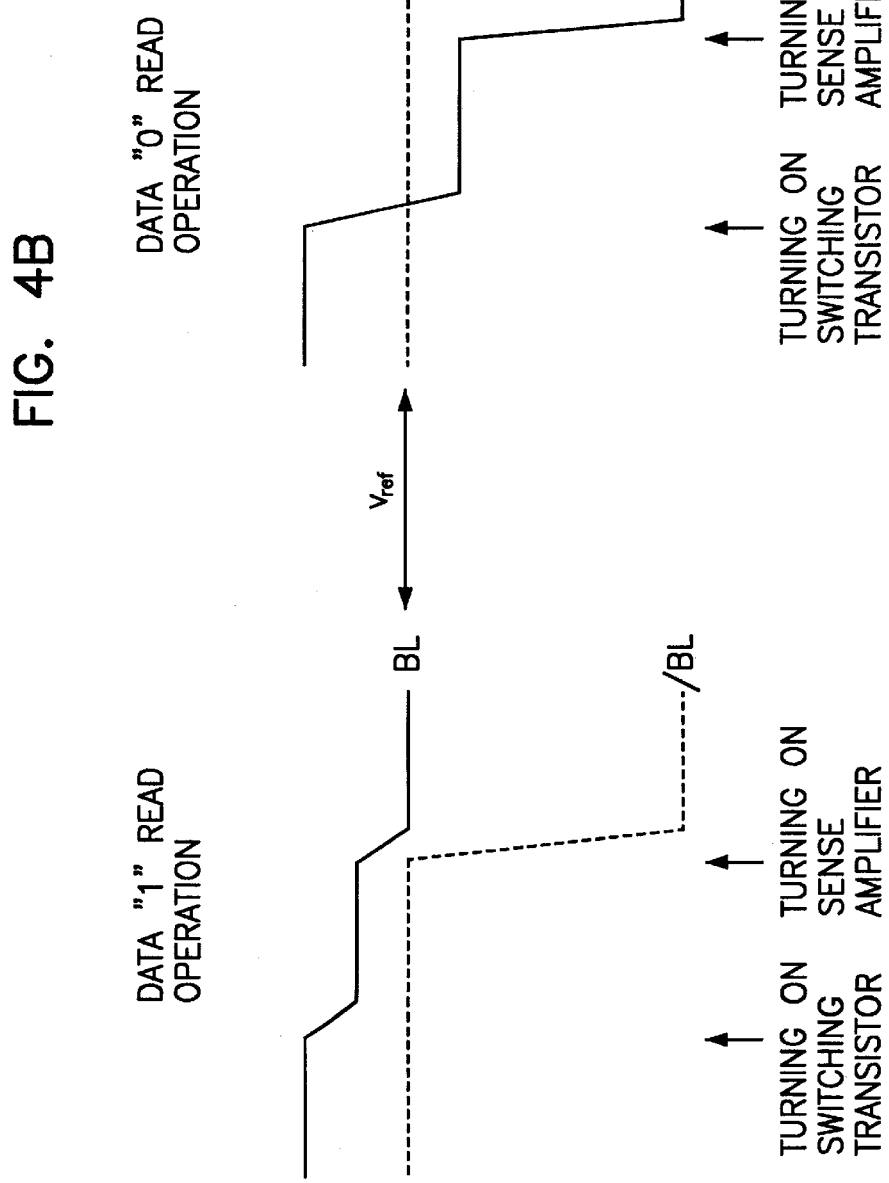
FIG. 4B is a timing diagram for a read operation of a ferroelectric memory device in accordance with the present invention.

FIGS. 4a and 4b are timing diagrams for read operations of the ferroelectric memory devices of the prior art and of the present invention, respectively. FIG. 4a shows a conventional timing diagram when the voltage of BL and the /BL are precharged to VCC and the switching transistor T1 turns on after the precharge operation. In the conventional timing, when stored data "1" is read out, the BL and the /BL voltages are lowered by the conducting of the switching transistor to produce a small voltage difference. And, the sense amplifier 210 operates to sense and amplify the voltage difference with a reference voltage Vref generated by a reference cell so that the BL is amplified to VCC level while the /BL is amplified to VSS level. On the other hand, in case the read data is "0", the BL and the /BL are also lowered, when the switching transistor T1 turns on, to produce a small voltage difference. And, the sense amplifier 210 operates to sense and amplify the voltage difference with a reference voltage Vref generated by a reference cell so that the /BL is amplified to VCC level while the BL is amplified to VSS level.

FIG. 4b shows a timing diagram according to the present invention in which the BL is precharge to VCC+α and /BL is precharged to VCC. The switching transistor T1 is turned on after the precharge operation. When data "1" is read out, the voltage on the BL is lowered to a level higher than the VCC level, while the /BL voltage is remained to the VCC level. And then, the sense amplifier operates to amplify the BL to VCC and the /BL to VSS with the VCC level of the /BL being the reference voltage. On the other hand, when data "0" is read out, the potential of the BL is decreased to a level lower than the VCC level, while the potential of the /BL is maintained to be the VCC level. And then, the sense amplifier operates to amplify the BL to the VSS and the /BL to VCC with the VCC of the /BL being the reference voltage.

Figure 5:
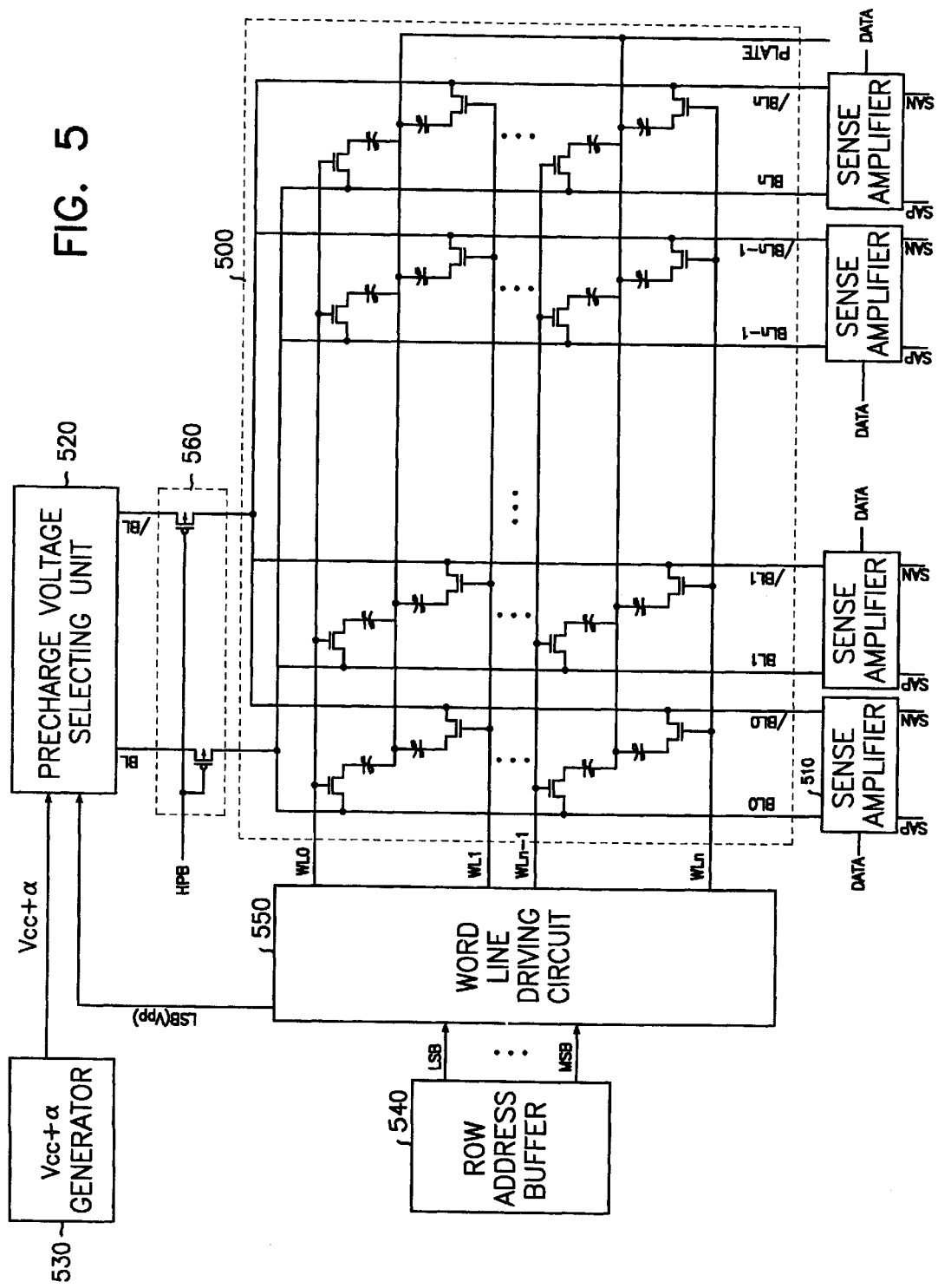
FIG. 5 is a circuit diagram of a ferroelectric memory device in accordance with the present invention.

FIG. 5 is a circuit diagram of a ferroelectric memory device according to the present invention. As described above, the memory device of the present invention is constructed to precharge the BL to VCC+α and the /BL to VCC for reading out data from the memory device without separate reference cell. A memory cell is comprised of one switching transistor and one ferroelectric capacitor. A memory array 500 includes a plurality of word lines and a plurality of bit lines crossed each other to form a matrix. Sense amplifiers 510 detect and amplify the voltage difference between the BL and the /BL. Row address buffers 540 pass externally coming row addresses for a memory cell to be selected, and the received row addresses are decoded by the word line driving circuit 550 to enable a selected word line WL. A precharge voltage selecting unit 520 transfers, without voltage loss, the VCC+α and the VCC to a precharge unit 560 responding to least significant bits (LSB) of bootstrapped row addresses coming from the word line driving circuit 550, so that the VCC+α and the VCC can be selectively transferred to the BL and the /BL. The precharge unit 560 precharges the BL and the /BL to the VCC+α and the VCC which are supplied from the precharge voltage selecting unit 520, respectively. A VCC+α generator 530 produces the voltage level of VCC+α for precharging the BL.

Figure 6:
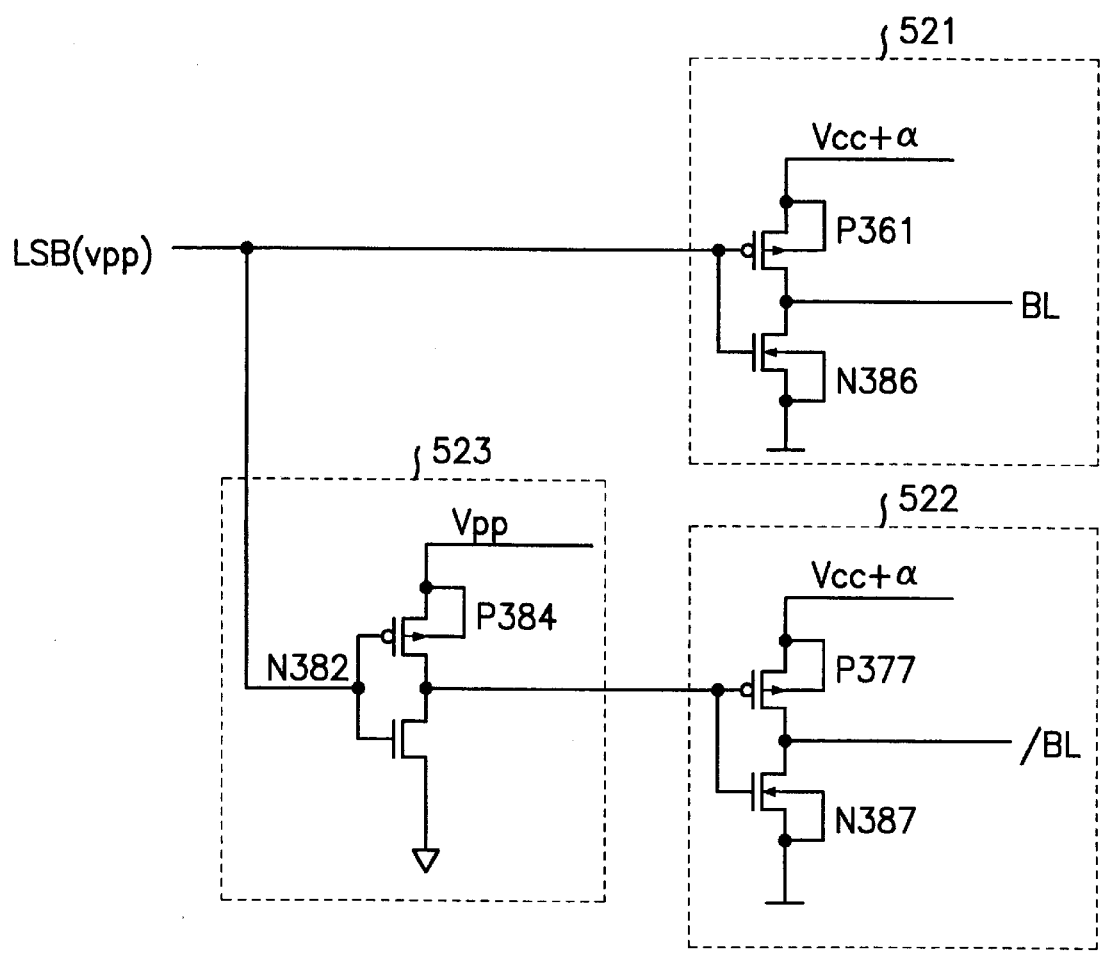
FIG. 6 is a circuit diagram of a precharge voltage selecting unit of the present invention.

FIG. 6 is a circuit diagram of the precharge voltage selecting unit 520. The precharge voltage selecting unit 520 includes a first circuit block 521 for choosing the precharge voltage for the BL, a second circuit block 523, and a third circuit block for choosing the precharge voltage for the /BL. The first circuit block 521 includes a PMOS transistor P361 and NMOS transistor N386 which are serially connected between the VCC+α and the VCC and receiving as a common gate input the bootstrapped LSB. The second circuit block 523 is provided with a PMOS transistor P384 and a NMOS transistor N382 serially connected between a positive supply voltage Vpp and the VSS to precharge the /BL to a lossless VCC level. The third circuit block 522 comprises a PMOS transistor P377 and a NMOS transistor N387 which are serially connected between the VCC+α and the VCC and receive as their common gate input the output signal of the second circuit block 523.

The operation of the memory device of the present invention will be explained with reference to FIGS. 5 and 6.

If the LSB coming from the row address buffer 540 is low, the low LSB is input to the precharge voltage selecting unit 520 via the word line driving circuit 550. This low signal is input as the common gate input to the precharge unit 560, so that the VCC+α generated by the VCC+α generator 530 is assigned to the BL and the VCC is assigned to the /BL. The precharge unit 560 precharges, with response to a bit line precharge signal HPB, to the VCC+α the BL (BL0 to BLn) which is connected to the even numbered word lines (WL0 to WLn−1) via a NMOS transistor, and precharges the /BL to the VCC. On the other hand, when the LSB has high level, this high signal is boosted to higher level through the word line driving circuit 550 and then enters into the precharge voltage selecting unit 520. Receiving the high signal as its common gate input, the precharge voltage selecting unit 520 chooses the VCC+α from the generator 530 for the BL and the VCC for the /BL. Responding to the bit line precharge signal HPB, the precharging unit 560 precharges the BL (BL0 to BLn) connected to odd numbered word line (WL1 to WLn) to the VCC+α level and the /BL (/BL0 to /BLn) to the VCC level.

When the selected word line is driven, the precharged voltage VCC+α on each of the BL is changed to a voltage level either higher or lower than the VCC on the /BL depending on the stored data value of "0" or "1". At this time, driving signals SAP and SAN for the sense amplifier are enabled to amplify the voltage on the BL and to read out the stored data "0" or "1". Signal waveform during this operation is shown in FIG. 7.

With reference to FIGS. 5 to 7, a read operation to read out data "0" or "1" stored in the ferroelectric capacitor C1 will be explained.

First, in a stand-by state, high level of the PBL is input to precharge the BL and the /BL to the VSS. In time interval A shown in FIG. 7, the HPB signal is made low to charge the BL to the VCC+α while the /BL to the VCC. When the WL signal goes high in time interval B, large positive voltage is applied to electrodes of the ferroelectric capacitor so that the capacitor moves to point 'b' from point 'a' (when data "0" read operation) or moves to point 'h' from point 'g' (when data "1" read operation). In addition, the BL has a constant potential level 700 between the VCC+α and the VCC due to the charge sharing effect when data "1" is read out from the cell. On the other hand, in the data "0" read operation, the BL has a voltage level 710 lower than the VCC. At this time, the cell plate is supplied with the VSS and the /BL is maintained its previous VCC voltage level.

In time interval C, the sense amplifier starts to its operation to amplify the BL with reference to the VCC of the /BL, so that the BL is made to be the VSS (data "0" read) or the VCC (data "1" read). At this time, the point on the Q-V loop moves from point 'b' to point 'c' (data "0" read) or from point 'h' to point 'i' (data "1" read).

After read operation for the data is completed, restore operations are performed in time intervals D, E and F for returning to the initial state.

Although the invention has been shown and described with respect to the preferred embodiments, it will be understood by those skilled in the art that various changes and modifications may be made without departing from the spirit and scope of the invention as defined in the following claims.

What is claimed is:

1. A ferroelectric memory device provided with memory arrays which have a plurality of word line and a plurality of positive and negative bit lines which are crossed each other in a matrix form, and sense amplifiers to detect and amplify a voltage difference between the positive and the negative bit lines, said memory device comprising:
   voltage generating means for producing positively pumped supply voltage;
   precharge voltage selecting means, responsive to least significant bits of row addresses from a word line driving circuit, for selecting the positively pumped supply voltage as a precharge voltage for the positive bit line and a normal supply voltage as a precharge voltage for the negative bit line; and precharging means for precharging the positive and the negative bit lines respectively to the positively pumped supply voltage and the normal supply voltage from the precharge voltage selecting means.

2. The ferroelectric memory device as recited in claim 1, wherein the positively pumped supply voltage is variable so as to control a sensing margin of the sense amplifier.

3. The ferroelectric memory device as recited in claim 1, wherein said precharge voltage selecting means comprising:

a first circuit, responsive to the least significant bit, for outputting the positively pumped supply voltage as a precharge voltage for the positive bit line;

an inverting means for inverting the least significant bit; and a second circuit, responsive to an output of the inverting means, for outputting the normal supply voltage as a precharge voltage for the negative bit line.

4. The ferroelectric memory device as recited in claim 3, wherein said first circuit comprises a first PMOS transistor and a first NMOS transistor which are serially connected between the positively pumped supply voltage and the normal supply voltage and receive as their common gate input the least significant bit.

5. The ferroelectric memory device as recited in claim 3, wherein said inverting means comprises a second PMOS transistor and a second NMOS transistor which are serially connected between a high supply voltage and a ground voltage and receive the least significant bit as their common gate input for producing a lossless supply voltage as the precharge voltage for the negative bit line.

6. The ferroelectric memory device as recited in claim 3, wherein said second circuit comprises a third PMOS transistor and a third NMOS transistor which are serially connected between the positively pumped supply voltage and the normal supply voltage and receive as their common gate input an output signal from the inverting mean.

7. The ferroelectric memory device as recited in claim 1, wherein said precharging means comprises a fourth PMOS transistor receiving as its gate input a first control signal and connected between the positively pumped supply voltage and the positive bit line, and a fifth PMOS transistor receiving as its gate input a bit line precharge signal and connected between the negative bit line and the normal supply voltage supplied from the precharge voltage selecting means.

8. A method for operating a ferroelectric memory device, which comprises memory arrays having a plurality of word line and a plurality of positive and negative bit lines which are crossed each other in a matrix form, sense amplifiers to detect and amplifier a voltage difference between the positive and the negative bit lines, voltage generating means for producing positively pumped supply voltage, precharge voltage selecting means, responsive to least significant bits of row addresses from a word line driving circuit, for selecting the positively pumped supply voltage as a precharge voltage for the positive bit line and a normal supply voltage as a precharge voltage for the negative bit line, and precharging means for precharging the positive and the negative bit lines respectively to the positively pumped supply voltage and the normal supply voltage from the precharge voltage selecting means, said method comprising the steps of:

precharging the positive and the negative bit lines to a ground voltage when the memory device in its stand-by state;

raising the positive bit line to the positively pumped supply voltage and raising the negative bit line to the normal supply voltage in response to a first control signal to read out data stored in memory cells;

applying a voltage to the ferroelectric capacitor when the word line is selected, so that the positive bit line has a first constant voltage level between the positively pumped supply voltage and the normal supply voltage due to a charge sharing effect when one binary state data is read out, while the positive bit line has a second constant voltage level lower than the normal supply voltage when the other binary state data is read out; and amplifying the first or the second constant voltage level appeared on the positive bit line with reference to the normal supply voltage appeared on the negative bit line, so that the positive bit line goes to the normal supply voltage to read out data "1" while the positive bit line goes to the ground voltage to read out data "0".

9. A method for operating a memory device provided with memory cells, each having a switching transistor and a ferroelectric capacitor for storing electric charges, and a plurality of positive and negative bit lines for transferring the electric charges, said method comprising the steps of:

raising the positive bit line to a first positive voltage level and the negative bit line to a second positive voltage level lower than the first positive voltage level;

turning on the switching transistor to induce a charge sharing effect between electric charges in both the ferroelectric capacitor and the positive line, so that a voltage difference is produced between the positive and the negative bit lines; and sensing the voltage difference and amplifying the voltage developed on the positive bit line to the second positive voltage level or to a ground voltage level depending on the electric charge stored in the ferroelectric capacitor.

10. The method as recited in claim 9, further comprising a precharge step for precharging, before said step of raising, the positive and the negative bit lines to the ground voltage level.

11. The method as recited in claim 9, wherein said step of turning on the switching transistor is initiated by a row address for selecting the memory cells.

12. The method as recited in claim 9, wherein said step of sensing and amplifying uses the second positive voltage level on the negative bit line as a reference voltage for the sensing.

13. A memory device comprising:

a plurality of memory cells, each including a switching transistor and a ferroelectric capacitor for storing electric charges;

a plurality of word lines for enabling the switching transistor;

a plurality of positive and negative bit lines for transferring the electric charges;

a sense amplifier for sensing a voltage difference between the positive and the negative bit lines and for amplifying the voltage levels of the positive and the negative bit lines; and voltage applying means for applying a positively pumped supply voltage to the positive bit line and applying a normal supply voltage lower than the positively pumped supply voltage to the negative bit line.

* * * * *